United States Patent
Tremel et al.

(10) Patent No.: US 8,702,202 B2
(45) Date of Patent: Apr. 22, 2014

(54) APPARATUS AND METHOD FOR PREVENTING SPLATTER FOR CONTINUOUS PRINTING

(75) Inventors: James Daniel Tremel, Santa Barbara, CA (US); Matthew Stainer, Goleta, CA (US); Matthew Dewey Hubert, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1149 days.

(21) Appl. No.: 12/647,818

(22) Filed: Dec. 28, 2009

(65) Prior Publication Data

US 2010/0188459 A1  Jul. 29, 2010

Related U.S. Application Data

(60) Provisional application No. 61/140,944, filed on Dec. 27, 2008.

(51) Int. Cl.
| | | |
|---|---|---|
| *B41J 2/165* | (2006.01) | |
| *B41J 2/015* | (2006.01) | |
| *B05B 7/00* | (2006.01) | |
| *B05C 5/00* | (2006.01) | |
| *B05D 1/00* | (2006.01) | |
| *B41J 29/17* | (2006.01) | |
| *H01L 51/00* | (2006.01) | |

(52) U.S. Cl.
CPC ............. *B41J 29/17* (2013.01); *H01L 51/0004* (2013.01)
USPC ................... 347/31; 347/29; 347/22; 347/20; 118/300; 427/331

(58) Field of Classification Search
None
See application file for complete search history.

(56) References Cited

U.S. PATENT DOCUMENTS

| | | | | |
|---|---|---|---|---|
| 4,356,429 A |   | 10/1982 | Tang | |
| 4,416,919 A | * | 11/1983 | Beck | 427/296 |
| 4,539,507 A |   | 9/1985 | VanSlyke et al. | |
| 4,596,990 A | * | 6/1986 | Hou | 347/41 |
| 4,881,085 A | * | 11/1989 | Gibson et al. | 347/30 |
| 5,247,190 A |   | 9/1993 | Friend et al. | |
| 5,317,169 A |   | 5/1994 | Nakano et al. | |
| 5,408,109 A |   | 4/1995 | Heeger et al. | |
| 5,755,881 A | * | 5/1998 | Fenoglio et al. | 118/50 |
| 6,303,238 B1 |   | 10/2001 | Thompson et al. | |

(Continued)

FOREIGN PATENT DOCUMENTS

| | | |
|---|---|---|
| EP | 1191612 B1 | 9/2001 |
| EP | 1191614 B1 | 9/2001 |

(Continued)

OTHER PUBLICATIONS

Kirk-Othmer Encyclopedia of Chemical Technology, Fourth Edition, vol. 18, p. 837-860, 1996, by Y. Wang.

(Continued)

*Primary Examiner* — Dah-Wei D Yuan
*Assistant Examiner* — Jethro Pence

(57) ABSTRACT

An apparatus and method for liquid-phase dispensing of layers onto a substrate of an electronic device. An absorbent material reduces or eliminates splatter of printing material on the substrate during continuous printing operations. The absorbent material can be regenerated by exposure of new surface area or vacuum drawing of printing material through the absorbent material.

16 Claims, 2 Drawing Sheets

(56) References Cited

U.S. PATENT DOCUMENTS

| | | |
|---|---|---|
| 6,459,199 B1 | 10/2002 | Kido et al. |
| 6,670,645 B2 | 12/2003 | Grushin et al. |
| 2001/0019782 A1 | 9/2001 | Igarashi et al. |
| 2002/0121638 A1 | 9/2002 | Grushin et al. |
| 2003/0146957 A1* | 8/2003 | Jeanmaire ................. 347/73 |
| 2008/0156851 A1* | 7/2008 | Ramanan et al. ............ 228/223 |

FOREIGN PATENT DOCUMENTS

| | | |
|---|---|---|
| JP | 2006-247473 A | 9/2006 |
| WO | 00/07655 A2 | 11/2000 |
| WO | 00/70655 A2 | 11/2000 |
| WO | 03/008424 A1 | 1/2001 |
| WO | 01/41512 A1 | 6/2001 |
| WO | 02/02714 A2 | 1/2002 |
| WO | 02/15645 A1 | 2/2002 |
| WO | 02/31896 A2 | 5/2002 |
| WO | 03/040257 A1 | 5/2003 |
| WO | 03/063555 A1 | 7/2003 |
| WO | 03/091688 A2 | 11/2003 |
| WO | 2004/016710 A1 | 2/2004 |

OTHER PUBLICATIONS

International Search Report, PCT/US2009/069568, PCT Counterpart of the Present Application, KIPO, Daejeon Rok, Ju Seung Kim, Authorized Officer, Aug. 11, 2010.

CRC Handbook of Chemistry and Physics, 81$^{st}$ Edition (2000-2001) (Book Not Included).

* cited by examiner

APPARATUS AND METHOD FOR PREVENTING SPLATTER FOR CONTINUOUS PRINTING

RELATED APPLICATION

This application claims priority under 35 U.S.C. §119(e) from Provisional Application No. 61/140,944 filed Dec. 27, 2008 which is incorporated by reference in its entirety.

FIELD OF THE DISCLOSURE

This invention relates in general to an apparatus and process for making an electronic device. In particular, it relates to a series of nozzles for continuous dispensing of a liquid-phase printing material, and an absorbent material to reduce splatter of the printing material on a substrate.

BACKGROUND INFORMATION

Increasingly, active organic molecules are used in electronic devices. These active organic molecules have electronic or electro-radiative properties including electroluminescence. Electronic devices that incorporate organic active materials may be used to convert electrical energy into radiation and may include a light-emitting diode, light-emitting diode display, or diode laser.

Two methods are commonly used to prepare organic light-emitting diode ("OLED") displays: vacuum deposition, and liquid-phase processing. (The latter includes all forms of applying the layers from a fluid, as a true solution or a suspension.) Vacuum deposition equipment typically has very high investment costs, and inferior material utilization (high operating costs), so liquid-phase processing is preferred, especially for large area displays.

Liquid-phase processing for the deposition of organic active layers include any number of technologies for control of layer thickness on a substrate. Some of these technologies include self regulated methods to control thickness, including spin coating, rod coating, dip coating, roll coating, gravure coating or printing, lithographic or flexographic printing, screen coating etc. Other of these technologies seek to control deposition thickness using controlled deposition techniques including ink jet printing, spray coating, nozzle coating, slot die coating, curtain coating, bar or slide coating, etc.

Self regulated techniques suffer a number of drawbacks. Fluids used in coating OLED displays are often applied over surfaces with topography—electrodes, contact pads, thin film transistors, pixel wells formed from photoresists, cathode separator structures, etc. The uniformity of the wet layer deposited by a self regulated technique depends on the coating gap and resulting pressure distribution, so variations in the substrate topography result in undesirable variations in the wet coating thickness. Self regulated techniques generally suffer higher operating costs in that not all the fluid presented to the substrate is deposited. Some fluid is either recycled in the fluid bath (e.g., dip coating), or on the applicator (e.g., roll or gravure coating), or, it is wasted (e.g., spin coating). Solvent evaporates from the recycled fluid, requiring adjustment to maintain process stability. Wasting material, and recycling and adjusting material, adds cost.

Controlled techniques can provide lower operating costs. However, in some cases, continuous printing can lead to deposition of printing material outside the desired locations on a designated substrate. In one mode, the continuous liquid-phase printing material can break up into undesired droplets and deposit in undesired locations on the substrate. This defect is often referred to as splatter, and can cause performance degradation of the electronic device.

Previous techniques to address this problem involved collection of excessive printing material in a duct or channel and removal using an exhaust air flow. This solution has proved ineffective to eliminate the splatter defect. Another technique involved maintaining a collection surface at the same gap, or distance, between nozzle and surface to be printed. This maintains the continuous stream, or pillar, of the printing material. However, this solution causes puddling of the stream, or droplets upon reversal of the nozzle(s) in changing direction to make additional passes along the substrate. Solutions to the splatter issue include methods to reduce or eliminate the degradation of the pillar of printing material into aerosol size droplets, and additionally, eliminate puddling upon reversal of the nozzle(s) at end of printing pass.

Inconsistent formation of organic layers typically leads to poor device performance and poor yield in device fabricating processes. There continues to be a need for improved processes for the liquid-phase deposition of organic materials for OLED applications.

SUMMARY OF THE DISCLOSURE

In a controlled coating method all the fluid supplied to the nozzle(s) is applied to the substrate or workpiece. Relative motion between the nozzle and substrate allows deposition of printing material in a uniform and precise manner. This relative motion can be achieved by moving the set of nozzles over a fixed substrate, or alternatively, moving the substrate relative to fixed set of nozzles, or a combination wherein both the substrate and the set of nozzles are in motion. In any of the above scenarios, the printing operation makes a printing run, also called a pass, across the substrate, followed by a second pass in a generally opposite direction to the first pass. These printing passes are continued until completion of the substrate. This reversal of direction from the first to the second pass produces splatter of the printing material on the substrate, and subsequent operating problems with the resultant electronic device.

Continuous nozzle coating of organic layers for fabricating OLED displays produces layers on the order of tens of nanometers thick. Process improvements are required to produce acceptable layer performance at such thin dimensions.

At least one embodiment includes a nozzle assembly comprising a series of nozzles capable of dispensing a continuous stream of printing material onto a substrate, in addition to an absorbing material for reducing splatter of the printing material and a device to regenerate absorbing capacity of the absorbing material. The series of nozzles comprises at least 3 nozzles, but can include 6, 9, 12 or more nozzles. In one embodiment the absorbing material can have a smooth or irregular surface, and can be selected from the group consisting of sponges, natural fibers, synthetic fibers and porous media. In one embodiment the device to regenerate absorbing capacity is a rotational device to move the absorbing material and expose additional surface area. In one embodiment a vacuum source draws the printing material through the absorbing material to regenerate the absorbing material. In one embodiment dispensing the continuous stream occurs in a first direction, then directing excess printing material onto the absorbing material, followed by printing in a second direction.

DETAILED DESCRIPTION

Figure 1:
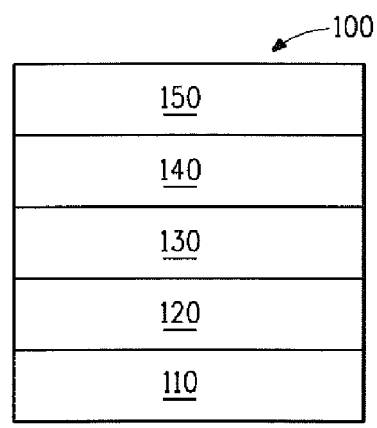
FIG. 1 is an illustration of an electronic device.

One example of an electronic device comprising an organic light-emitting diode ("OLED") is shown in FIG. 1 and designated 100. The device has an anode layer 110, a buffer layer 120, a photoactive layer 130, and a cathode layer 150. Adjacent to the cathode layer 150 is an optional electron-injection/transport layer 140. Between the buffer layer 120 and the photoactive layer 130, is an optional hole-injection/transport layer (not shown).

As used herein, the term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions. The term "hole transport" when referring to a layer, material, member, or structure, is intended to mean such layer, material, member, or structure facilitates migration of positive charges through the thickness of such layer, material, member, or structure with relative efficiency and small loss of charge. The term "electron transport" when referring to a layer, material, member or structure, is intended to mean such a layer, material, member or structure that promotes or facilitates migration of negative charges through such a layer, material, member or structure into another layer, material, member or structure. The term "hole injection" when referring to a layer, material, member, or structure, is intended to mean such layer, material, member, or structure facilitates injection and migration of positive charges through the thickness of such layer, material, member, or structure with relative efficiency and small loss of charge. The term "electron injection" when referring to a layer, material, member, or structure, is intended to mean such layer, material, member, or structure facilitates injection and migration of negative charges through the thickness of such layer, material, member, or structure with relative efficiency and small loss of charge.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

In one embodiment, the buffer layer 120 comprises hole transport materials. Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, poly(9,9,-dioctyl-fluorene-co-N-(4-butylphenyl)diphenylamine), and the like, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

The photoactive layer 130 may typically be any organic electroluminescent ("EL") material, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including liquid-phase processing. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, include metal chelated oxinoid compounds, such as tris(8-hydroxyquinolato)aluminum (Alq3), bis(2-methyl-8-quinolinolato) (para-phenyl-phenolato)aluminum(III) (BAlQ), and tetrakis-(8-hydroxyquinolinato)zirconium (IV) (ZrQ); and azole compounds such as 2-(4-biphenylyl)-5-(4-t-butylphenyl-1,3, 4-oxadiazole (PBD), 3-(4-biphenylyl)-4-phenyl-5-(4-t-butylphenyl-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm. In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

Figure 2:
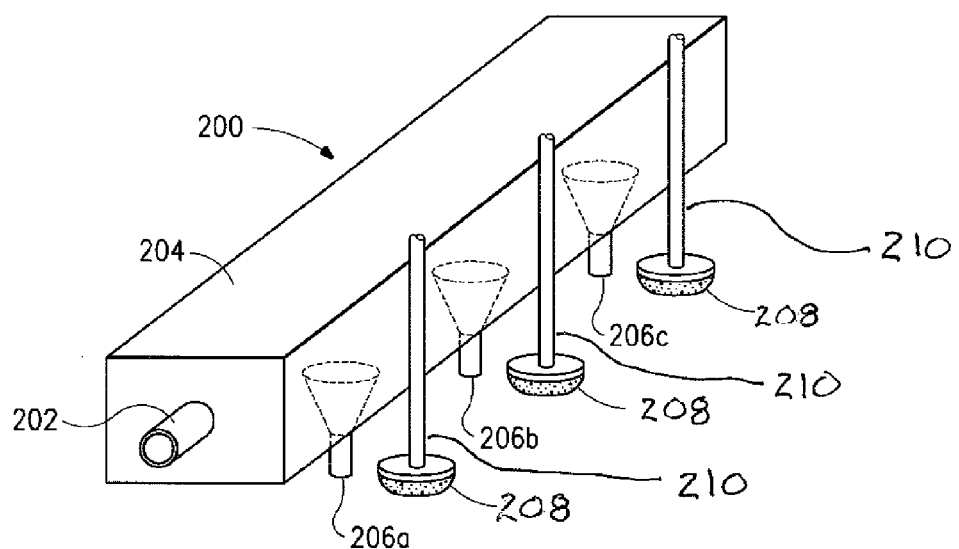
FIG. 2 is an illustration of one embodiment of a series of nozzles of the present invention.

FIG. 2 illustrates one embodiment of a series of nozzles 200. An inlet 202 directs printing material (not shown) into nozzle structure 204 having at least 3 nozzles 206a, 206b and 206c. The nozzle structure 204 can contain 6, 9, 12 or any series of desired nozzles. An absorbent material 208 is located adjacent each nozzle 206 to absorb excess printing material (not shown). The absorbent material 208 can comprise any number of absorbent materials including porous media of ceramic, metal, plastic or natural product based. The porous media containing pore sizes from 5 to 500 μm. In one embodiment the porous media can be stainless steel or porous plastic. The absorbent material 208 can be located on a moveable arm 210, capable of absorbing the effluent from nozzle 206 after a first printing pass and prior to beginning a second printing pass.

Figure 3:
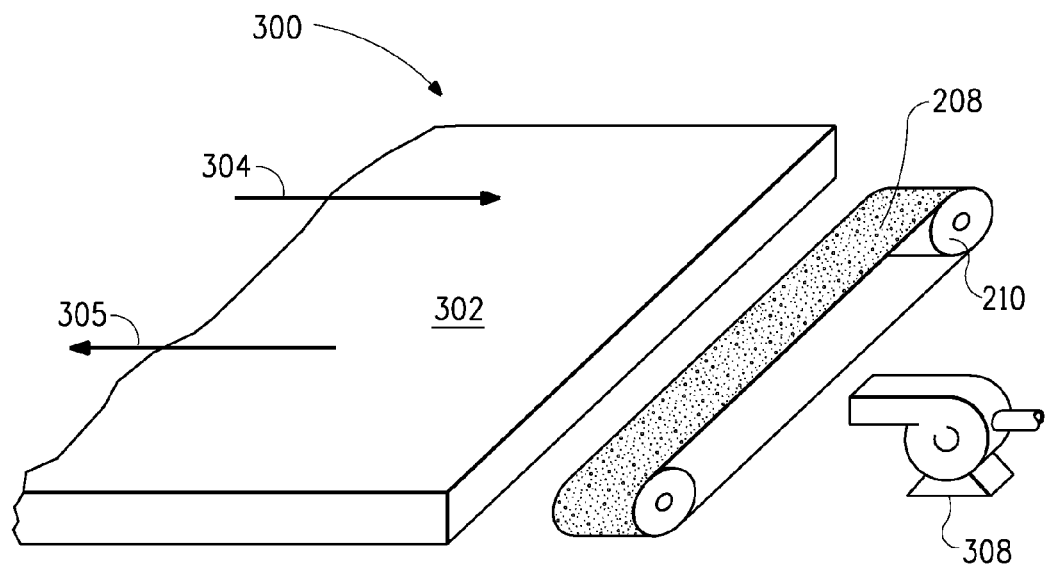
FIG. 3 is an illustration of another embodiment with a substrate having adjacent absorbent material and vacuum device of the present invention.

FIG. 3 illustrates one embodiment of a structure 300 having absorbent material 208 located adjacent a substrate 302. The nozzle structure 204 (not shown in FIG. 3) can make a printing pass in a first direction 304, reverse direction, and make a second printing pass in a second direction 306. The pillar of the printing material is maintained by keeping the gap from nozzle 206 to substrate 302 constant during the reversal of direction. The absorbent material 208 can be driven by a rotational device 210 to expose additional surface area. In one embodiment a vacuum source 308 can be used to regenerate the printing material 208 by removing previously absorbed printing material.

The printing material in the above embodiments can be a buffer layer, a charge-blocking layer, a charge-injection layer, a charge-transport layer, an electroluminescent layer or a combination thereof. The printing material comprises a liquid and a solid material to produce a solution, suspension, dispersion, emulsion, colloidal mixtures, or other compositions. The liquid can be an organic solvent or water, as discussed later in this description. The solid is any one or more of the materials used in the buffer layer 120, EL layer 130 or optional layer 140.

In a further embodiment, the liquid mixture has a viscosity no greater than 5 centipoise. In still a further embodiment, the liquid mixture includes a liquid solvent, wherein the liquid solvent may include at two or more solvents. In yet a further embodiment, at least one of the solvents is water.

Additional equipment may reside within or be used with the nozzle structure 204, including containers and feed lines fluidly coupled to the nozzle structure 204 to accommodate any number of constituents to form the liquid-phase mixture. Other equipment can include any one or more stepper motors, pumps, filters, control electronics, other electrical, mechanical, or electro-mechanical assemblies or subassemblies, facilities connections, or any combination thereof.

3. Liquid Compositions

The series of nozzles 200 can be used to deposit a variety of different materials, including liquid solutions. The following paragraphs include only some but not all of the materials that may be used. In one embodiment, one or more materials for an organic layer within an electronic device are formed using the series of nozzles 200.

The series of nozzles 200 is well suited for printing liquid compositions. The series of nozzles 200 allows a wider range of operating parameters and liquid compositions to be used compared to a conventional ink-jet printer. In one embodiment, one or more parameters can affect the flow characteristics of the liquid composition. Viscosity is a parameter that can affect the flow characteristics. The viscosity can be affected by selection of the liquid medium, the solids content within the liquid medium, temperature of the liquid composition, or potentially one or more other factors, or any combination thereof. Viscosity can be affected directly by temperature (viscosity of the liquid medium increases with decreasing temperature or decreases with increasing temperature) or indirectly by changing the evaporation rate of the liquid medium within the liquid composition (i.e., using liquid medium having lower or higher boiling points, changing the temperature of the liquid composition, or a combination thereof). After reading this specification, skilled artisans will appreciate that they have many different ways to allow a significantly larger selection of liquid medium, a larger range of solids concentration of the liquid composition to be used, or a combination thereof.

The liquid mixture can be in the form of a solution, dispersion, emulsion, or suspension. In the paragraphs that follow, non-limiting examples of solid materials and liquid medium are given. The solid material(s) can be selected upon the electronic or electro-radiative properties for a subsequently-formed layer. The liquid medium can be selected based on criteria described later in this specification.

When using the series of nozzles 200, the liquid composition may have solid(s) greater than approximately 2.0 weight percent without having to worry about clogging. In one embodiment, the solid(s) content is in a range of approximately 2.0 to 3.0 weight percent. Therefore, the series of nozzles 200 can use a liquid composition having a higher viscosity or lower boiling point compared to a conventional ink-jet printer. Further, the series of nozzles 200 can use a liquid composition having a lower viscosity or higher boiling point compared to a conventional ink-jet printer. Additionally, the liquid medium within a liquid composition does not need to be degassed before printing. For example, a conventional ink-jet printer used for dispensing a conductive organic material within an aqueous solution requires the aqueous solvent to be degassed. However, because series of nozzles 200 allows for more processing margin, degassing of a liquid medium is not required for the proper operation of the series of nozzles 200.

An organic layer printed using the series of nozzles 200 can include an organic active layer, (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, suitable radiation-emitting materials include one or more small molecule materials, one or more polymeric materials, or a combination thereof. A small molecule material may include any one or more of those described in, for example, U.S. Pat. No. 4,356,429 ("Tang"); U.S. Pat. No. 4,539,507 ("Van Slyke"); U.S. Patent Application Publication No. US 2002/0121638 ("Grushin"); or U.S. Pat. No. 6,459,199 ("Kido"). Alternatively, a polymeric material may include any one or more of those described in U.S. Pat. No. 5,247,190 ("Friend"); U.S. Pat. No. 5,408,109 ("Heeger"); or U.S. Pat. No. 5,317,169 ("Nakano"). An exemplary material is a semiconducting conjugated polymer. An example of such a polymer includes poly(paraphenylenevinylene) (PPV), a PPV copolymer, a polyfluorene, a polyphenylene, a polyacetylene, a polyalkylthiophene, poly(n-vinylcarbazole) (PVK), or the like. In one specific embodiment, a radiation-emitting active layer without any guest material may emit blue light.

For a radiation-responsive organic active layer, a suitable radiation-responsive material may include a conjugated polymer or an electroluminescent material. Such a material includes, for example, a conjugated polymer or an electro- and photo-luminescent material. A specific example includes poly(2-methoxy,5-(2-ethyl-hexyloxy)-1,4-phenylene vinylene) ("MEH-PPV") or a MEH-PPV composite with CN-PPV.

For a hole-injecting layer, hole-transport layer, electron-blocking layer, or any combination thereof, a suitable material includes polyaniline ("PANI"), poly(3,4-ethylenedioxythiophene) ("PEDOT"), polypyrrole, an organic charge transfer compound, such as tetrathiafulvalene tetracyanoquinodimethane ("TTF-TCQN"), a hole-transport material as described in Kido, or any combination thereof.

For an electron-injecting layer, electron transport layer, hole-blocking layer, or any combination thereof, a suitable material includes a metal-chelated oxinoid compound (e.g., Alq$_3$ or aluminum(III)bis(2-methyl-8-quinolinato)4-phenylphenolate ("BAlq")); a phenanthroline-based compound (e.g., 2,9-dimethyl-4,7-diphenyl-1,10-phenanthroline ("DDPA") or 9,10-diphenylanthracene ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); an electron transport material as described in Kido; a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl)biphenyl ("CBP"); 9,10-bis-[4-(2,2-diphenylvinyl-phenyl]-anthracene ("BDPVPA"); anthracene, N-arylbenzimidazoles (such as "TPBI"); 1,4-bis[2-(9-ethyl-3-carbazoyl)vinylenyl]benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene)vinylenyl]benzene; 4,4'-bis[2,2-(9,9-fluorenylene)vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl) iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV; or any combination thereof.

For an electronic component, such as a resistor, transistor, capacitor, etc., the organic layer may include one or more of thiophenes (e.g., polythiophene, poly(alkylthiophene), alkylthiophene, bis(dithienthiophene), alkylanthradithiophene, etc.), polyacetylene, pentacene, phthalocyanine, or any combination thereof.

Examples of an organic dye include 4-dicyanmethylene-2-methyl-6-(p-dimethyaminostyryl)-4H-pyran (DCM), coumarin, pyrene, perylene, rubrene, a derivative thereof, or any combination thereof.

Examples of an organometallic material include a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum ($Alq_3$); a cyclometalated iridium or platinum electroluminescent compound, such as a complex of iridium with phenylpyridine, phenylquinoline, or phenylpyrimidine ligands as disclosed in published PCT Application WO 02/02714, an organometallic complex described in, for example, published applications US 2001/0019782, EP 1191612, WO 02/15645, WO 02/31896, and EP 1191614; or any mixture thereof.

An examples of a conjugated polymer includes a poly(phenylenevinylene), a polyfluorene, a poly(spirobifluorene), a copolymer thereof, or any combination thereof.

Selecting a liquid medium can also be an important factor for achieving one or more proper characteristics of the liquid mixture. A factor to be considered when choosing a liquid medium includes, for example, viscosity of the resulting solution, emulsion, suspension, or dispersion, molecular weight of a polymeric material, solids loading, type of liquid medium, boiling point of the liquid medium, temperature of an underlying substrate, thickness of an organic layer that receives a guest material, or any combination thereof In some embodiments, the liquid medium includes at least one solvent. An exemplary organic solvent includes a halogenated solvent, a colloidal-forming polymeric acid, a hydrocarbon solvent, an aromatic hydrocarbon solvent, an ether solvent, a cyclic ether solvent, an alcohol solvent, a glycol solvent, a ketone solvent, a nitrile solvent, a sulfoxide solvent, an amide solvent, or any combination thereof.

An exemplary halogenated solvent includes carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, or any combination thereof.

An exemplary colloidal-forming polymeric acid includes a fluorinated sulfonic acid (e.g., fluorinated alkylsulfonic acid, such as perfluorinated ethylenesulfonic acid) or any combinations thereof.

An exemplary hydrocarbon solvent includes pentane, hexane, cyclohexane, heptane, octane, decahydronaphthalene, a petroleum ether, ligroine, or any combination thereof.

An exemplary aromatic hydrocarbon solvent includes benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, 4-methylanisole, 3,4-dimethylanisole, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

An alcohol ether solvent may also be employed. An exemplary alcohol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, or any combination thereof.

An exemplary glycol solvent includes ethylene glycol, propylene glycol, propylene glycol monomethyl ether (PGME), dipropylene glycol monomethyl ether (DPGME), or any combination thereof.

An exemplary ketone solvent includes acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent includes dimethyl sulfoxide, di-n-butyl sulfoxide, tetramethylene sulfoxide, methyl phenyl sulfoxide, or any combinations thereof.

An exemplary amide solvent includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combinations thereof.

A crown ether contemplated includes any one or more crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combination thereof.

In another embodiment, the liquid medium includes water. A conductive polymer complexed with a water-insoluble colloid-forming polymeric acid can be deposited over a substrate and used as a charge-transport layer.

Many different classes of liquid medium (e.g., halogenated solvents, hydrocarbon solvents, aromatic hydrocarbon solvents, water, etc.) are described above. Mixtures of more than one of the liquid medium from different classes may also be used.

The liquid mixture may also include an inert material, such as a binder material, a filler material, or a combination thereof. With respect to the liquid mixture, an inert material does not significantly affect the electronic, radiation emitting, or radiation responding properties of a layer that is formed by or receives at least a portion of the liquid mixture.

It is to be appreciated that certain features of the invention which are for clarity, described above in the context of separate embodiments, may also be provided in combination in a single embodiment. Conversely, various features of the invention that are, for brevity described in the context of a single embodiment, may also be provided separately or in any subcombination. Further, reference to values stated in ranges include each and every value within that range.

The invention claimed is:

1. An apparatus comprising:
a series of nozzles configured to dispense a continuous stream of printing material onto a substrate;
an absorbing material for reducing splatter of the printing material, the absorbent material is adjacent the substrate; and
a device to regenerate absorbing capacity of the absorbing material, wherein the device is a rotational device to move the absorbing material and the device comprises a vacuum source to draw the printing material through the absorbing material.

2. The apparatus of claim 1 wherein the series of nozzles comprises at least 3 nozzles.

3. The apparatus of claim 1 wherein the series of nozzles comprises at least 6 nozzles.

4. The apparatus of claim 1 wherein the series of nozzles comprises at least 9 nozzles.

5. The apparatus of claim 1 wherein the series of nozzles comprises at least 12 nozzles.

6. The apparatus of claim 1 wherein the absorbing material contains a smooth surface.

7. The apparatus of claim 1 wherein the absorbing material contains an irregular surface.

8. The apparatus of claim 7 wherein the absorbing material is selected from the group consisting of sponges, natural fibers and synthetic fibers.

9. A liquid-phase coating process comprising:
providing a series of nozzles;
providing an absorbing material;
providing a device to regenerate absorbing capacity of the absorbing material;
dispensing a continuous stream of printing material onto a substrate, the absorbent material is adjacent the substrate; and
directing excess printing material onto the absorbing material for reducing splatter of the printing material, wherein the device is a rotational device to move the absorbing material and the device comprises a vacuum source to draw the printing material through the absorbing material.

10. The process of claim 9 wherein dispensing the continuous stream occurs in a first direction, then directing excess printing material onto the absorbing material, followed by printing in a second direction.

11. The process of claim 10 wherein the first direction is opposite the second direction.

12. The process of claim 9 wherein the series of nozzles comprises at least 3 nozzles.

13. The process of claim 9 wherein the series of nozzles comprises at least 6 nozzles.

14. The process of claim 9 wherein the series of nozzles comprises at least 9 nozzles.

15. The process of claim 9 wherein the series of nozzles comprises at least 12 nozzles.

16. The process of claim 9 wherein the absorbing material is selected from the group consisting of sponges, natural fibers and synthetic fibers.

* * * * *